(12) United States Patent
Park et al.

(10) Patent No.: US 10,308,786 B2
(45) Date of Patent: Jun. 4, 2019

(54) POWER INDUCTOR AND METHOD FOR MANUFACTURING THE SAME

(71) Applicant: MODA-INNOCHIPS CO., LTD., Ansan-Si, Gyeonggi-Do (KR)

(72) Inventors: In Kil Park, Seongnam-Si (KR); Gyeong Tae Kim, Ansan-Si (KR); Seung Hun Cho, Siheung-Si (KR); Jun Ho Jung, Siheung-Si (KR); Ki Joung Nam, Siheung-Si (KR); Jung Gyu Lee, Seoul (KR)

(73) Assignee: MODA-INNOCHIPS CO., LTD. (KR)

( * ) Notice: Subject to any disclaimer, the term of this patent is extended or adjusted under 35 U.S.C. 154(b) by 0 days.

(21) Appl. No.: 15/509,852

(22) PCT Filed: Apr. 27, 2015

(86) PCT No.: PCT/KR2015/004139
§ 371 (c)(1),
(2) Date: Mar. 8, 2017

(87) PCT Pub. No.: WO2016/039518
PCT Pub. Date: Mar. 17, 2016

(65) Prior Publication Data
US 2017/0256353 A1  Sep. 7, 2017

(30) Foreign Application Priority Data

Sep. 11, 2014 (KR) .................. 10-2014-0120128
Mar. 9, 2015 (KR) .................. 10-2015-0032404
Mar. 9, 2015 (KR) .................. 10-2015-0032405

(51) Int. Cl.
*H01F 27/29* (2006.01)
*C08K 3/28* (2006.01)
(Continued)

(52) U.S. Cl.
CPC .............. *C08K 3/28* (2013.01); *B22F 1/0062* (2013.01); *B22F 1/02* (2013.01); *B22F 3/02* (2013.01);
(Continued)

(58) Field of Classification Search
CPC .................................................... H01F 27/292
(Continued)

(56) References Cited

U.S. PATENT DOCUMENTS 5,712,047 A   1/1998 Aso et al.
5,850,682 A   12/1998 Ushiro
(Continued)

FOREIGN PATENT DOCUMENTS

CN   1258373 A   6/2000
CN   1801412 A   7/2006
(Continued)

OTHER PUBLICATIONS

International Search Report and Written Opinion for PCT/KR2015/004136 dated Jun. 30, 2015.
(Continued)

*Primary Examiner* — Jeremy C Norris
(74) *Attorney, Agent, or Firm* — Renaissance IP Law Group LLP

(57) ABSTRACT

Provided are a power inductor including a body, a base disposed in the body, a coil disposed on the base, a first external electrode connected to the coil, the first external electrode being disposed on a side surface of the body, and a second external electrode connected to the first external electrode, the second external electrode being disposed on a bottom surface of the body and a method for manufacturing the same.

19 Claims, 10 Drawing Sheets

(51) Int. Cl.
*H01F 27/00* (2006.01)
*B22F 1/00* (2006.01)
*B22F 1/02* (2006.01)
*B22F 3/02* (2006.01)
*B29C 43/02* (2006.01)
*B29C 65/00* (2006.01)
*C08K 3/04* (2006.01)
*C08K 3/08* (2006.01)
*C08K 3/22* (2006.01)
*C09K 5/14* (2006.01)
*C23C 18/16* (2006.01)
*C25D 7/12* (2006.01)
*H01F 27/34* (2006.01)
*H01F 41/02* (2006.01)
*H01F 41/04* (2006.01)
*H01F 41/10* (2006.01)
*H05K 1/18* (2006.01)
*H01F 17/00* (2006.01)
*H01F 17/04* (2006.01)
*H01F 27/28* (2006.01)
*B29L 31/34* (2006.01)
*H01F 27/22* (2006.01)

(52) U.S. Cl.
CPC ............ *B29C 43/02* (2013.01); *B29C 65/002* (2013.01); *C08K 3/04* (2013.01); *C08K 3/08* (2013.01); *C08K 3/22* (2013.01); *C09K 5/14* (2013.01); *C23C 18/1637* (2013.01); *C23C 18/1653* (2013.01); *C25D 7/123* (2013.01); *H01F 17/0013* (2013.01); *H01F 17/04* (2013.01); *H01F 27/008* (2013.01); *H01F 27/292* (2013.01); *H01F 27/34* (2013.01); *H01F 41/0233* (2013.01); *H01F 41/041* (2013.01); *H01F 41/10* (2013.01); *H05K 1/181* (2013.01); *B22F 2301/35* (2013.01); *B22F 2302/25* (2013.01); *B22F 2302/45* (2013.01); *B29L 2031/34* (2013.01); *C08K 2003/0856* (2013.01); *C08K 2003/222* (2013.01); *C08K 2003/282* (2013.01); *C08K 2201/001* (2013.01); *C08K 2201/01* (2013.01); *H01F 27/22* (2013.01); *H01F 2017/048* (2013.01); *H01F 2027/2809* (2013.01); *H05K 2201/1003* (2013.01)

(58) Field of Classification Search
USPC ........................................................ 336/223
See application file for complete search history.

(56) References Cited

U.S. PATENT DOCUMENTS

| | | | |
|---|---|---|---|
| 5,889,445 A | 3/1999 | Ritter et al. | |
| 6,218,925 B1 | 4/2001 | Iwao | |
| 6,356,181 B1 | 3/2002 | Kitamura | |
| 6,515,556 B1 | 2/2003 | Kato et al. | |
| 6,768,410 B1 | 7/2004 | Yazaki et al. | |
| 6,998,939 B2 | 2/2006 | Nakayama et al. | |
| 7,084,730 B2 | 8/2006 | Kitagawa | |
| 7,085,118 B2 | 8/2006 | Inoue et al. | |
| 7,408,435 B2 | 8/2008 | Nishikawa et al. | |
| 7,497,005 B2 | 3/2009 | Forbes et al. | |
| 7,652,554 B2 | 1/2010 | Moriai et al. | |
| 7,772,956 B2 | 8/2010 | Toi et al. | |
| 8,471,668 B2 | 6/2013 | Hsieh et al. | |
| 8,514,539 B2 | 8/2013 | Asakawa et al. | |
| 9,263,786 B2 | 2/2016 | Suga et al. | |
| 9,406,420 B2 | 8/2016 | Ohkubo et al. | |
| 9,558,890 B2 | 1/2017 | Hattori et al. | |
| 9,576,711 B2 | 2/2017 | Yoon et al. | |
| 9,647,315 B2 | 5/2017 | Yamatogi et al. | |
| 9,899,143 B2 | 2/2018 | Kim et al. | |
| 2002/0105406 A1 | 8/2002 | Liu et al. | |
| 2003/0030994 A1 | 2/2003 | Takaya et al. | |
| 2003/0134612 A1 | 7/2003 | Nakayama et al. | |
| 2005/0080346 A1 | 4/2005 | Gianchandani et al. | |
| 2007/0080769 A1 | 4/2007 | Thiel et al. | |
| 2008/0058652 A1 | 3/2008 | Payne | |
| 2009/0137067 A1 | 5/2009 | Forbes et al. | |
| 2010/0052838 A1 | 3/2010 | Matsuta et al. | |
| 2010/0301981 A1 | 12/2010 | Zeng et al. | |
| 2011/0007439 A1 | 1/2011 | Asakawa et al. | |
| 2011/0291790 A1 | 12/2011 | Okumura et al. | |
| 2011/0308072 A1 | 12/2011 | Ahn et al. | |
| 2012/0146757 A1 | 6/2012 | Tsai et al. | |
| 2012/0274432 A1 | 11/2012 | Jeong et al. | |
| 2012/0274435 A1 | 11/2012 | Jeong et al. | |
| 2013/0038417 A1 | 2/2013 | Kim et al. | |
| 2013/0082812 A1 | 4/2013 | Yoo et al. | |
| 2013/0162385 A1 | 6/2013 | Kwak et al. | |
| 2013/0169401 A1 | 7/2013 | Lee et al. | |
| 2013/0222101 A1 | 8/2013 | Ito et al. | |
| 2013/0307655 A1 | 11/2013 | Saito et al. | |
| 2013/0341758 A1 | 12/2013 | Lee et al. | |
| 2014/0001397 A1 | 1/2014 | Park et al. | |
| 2014/0022041 A1 | 1/2014 | Park et al. | |
| 2014/0022042 A1 | 1/2014 | Park et al. | |
| 2014/0050001 A1 | 2/2014 | Inaba | |
| 2014/0077914 A1 | 3/2014 | Ohkubo et al. | |
| 2014/0132387 A1 | 5/2014 | Shin | |
| 2014/0176284 A1 | 6/2014 | Lee et al. | |
| 2014/0184374 A1 | 7/2014 | Park et al. | |
| 2014/0218150 A1 | 8/2014 | Cho et al. | |
| 2014/0333401 A1 | 11/2014 | Esaki et al. | |
| 2014/0333404 A1 | 11/2014 | Bae et al. | |
| 2015/0087945 A1 | 3/2015 | Ziaie et al. | |
| 2015/0116966 A1* | 4/2015 | Lee .................. | H01G 4/40 361/767 |
| 2015/0145616 A1 | 5/2015 | Kim | |
| 2015/0213960 A1 | 7/2015 | Moon et al. | |
| 2015/0255206 A1 | 9/2015 | Han et al. | |
| 2015/0325362 A1 | 11/2015 | Kumura et al. | |
| 2015/0340149 A1 | 11/2015 | Lee et al. | |
| 2015/0340150 A1 | 11/2015 | Nakamura et al. | |
| 2016/0055964 A1* | 2/2016 | Park .................. | H05F 3/04 336/105 |

FOREIGN PATENT DOCUMENTS

| | | |
|---|---|---|
| CN | 101017728 A | 8/2007 |
| CN | 201950034 U | 8/2011 |
| CN | 102969109 A | 3/2013 |
| CN | 103035354 A | 4/2013 |
| CN | 103180919 A | 6/2013 |
| CN | 103456458 A | 12/2013 |
| CN | 103515077 A | 1/2014 |
| CN | 103578708 A | 2/2014 |
| DE | 102005039379 A1 | 3/2007 |
| JP | 08097045 A | 4/1996 |
| JP | 08264323 A | 10/1996 |
| JP | 10241942 A | 9/1998 |
| JP | 1154336 U | 2/1999 |
| JP | 11150357 A | 6/1999 |
| JP | 11260618 A | 9/1999 |
| JP | 200157311 A | 2/2001 |
| JP | 2001338813 A | 12/2001 |
| JP | 2002231574 A | 8/2002 |
| JP | 2002305108 A | 10/2002 |
| JP | 2003297634 A | 10/2003 |
| JP | 2004056112 A | 2/2004 |
| JP | 200538872 A | 2/2005 |
| JP | 2005183952 A | 7/2005 |
| JP | 2006147901 A | 6/2006 |
| JP | 2006157738 A | 6/2006 |
| JP | 2006286934 A | 10/2006 |
| JP | 2006310812 A | 11/2006 |
| JP | 2007012969 A | 1/2007 |
| JP | 2007067214 A | 3/2007 |
| JP | 2007194474 A | 8/2007 |

(56) References Cited

FOREIGN PATENT DOCUMENTS

| | | |
|---|---|---|
| JP | 2008072073 A | 3/2008 |
| JP | 2008147403 A | 6/2008 |
| JP | 2009117479 A | 5/2009 |
| JP | 2009302386 A | 12/2009 |
| JP | 2010010536 A | 1/2010 |
| JP | 2010080550 A | 4/2010 |
| JP | 2010153445 A | 7/2010 |
| JP | 2010209469 A | 9/2010 |
| JP | 2011018756 A | 1/2011 |
| JP | 2011504662 A | 2/2011 |
| JP | 2011077157 A | 4/2011 |
| JP | 2011258608 A | 12/2011 |
| JP | 2011530172 A | 12/2011 |
| JP | 2012089765 A | 5/2012 |
| JP | 2012109292 A | 6/2012 |
| JP | 2013042102 A | 2/2013 |
| JP | 2013098282 A | 5/2013 |
| JP | 2013521414 A | 6/2013 |
| JP | 2013239542 A | 11/2013 |
| JP | 2013251553 A | 12/2013 |
| JP | 2014011467 A | 1/2014 |
| JP | 2014013815 A | 1/2014 |
| JP | 2014013824 A | 1/2014 |
| JP | 2014503118 A | 2/2014 |
| JP | 6450565 B2 | 3/2014 |
| JP | 2014060284 A | 4/2014 |
| JP | 2014107548 A | 6/2014 |
| JP | 2014110425 A | 6/2014 |
| JP | 2014130988 A | 7/2014 |
| JP | 2016004917 A | 1/2016 |
| KR | 20070032259 A | 3/2007 |
| KR | 20120031754 A | 4/2012 |
| KR | 20120120819 A | 11/2012 |
| KR | 20120122589 A | 11/2012 |
| KR | 20120122590 A | 11/2012 |
| KR | 20130046108 A | 5/2013 |
| KR | 101338139 B1 | 12/2013 |
| KR | 20130135298 A | 12/2013 |
| KR | 101352631 B1 | 1/2014 |
| KR | 20140002355 A | 1/2014 |
| KR | 20140003056 A | 1/2014 |
| KR | 20140066437 A | 6/2014 |
| KR | 20140085997 A | 7/2014 |
| TW | 200915358 A | 4/2009 |
| TW | 201346951 A | 11/2013 |
| TW | 201346952 A | 11/2013 |
| WO | 2013042691 A1 | 3/2013 |
| WO | 2014087888 A1 | 6/2014 |

OTHER PUBLICATIONS

International Search Report and Written Opinion for PCT/KR2015/004137 dated Jun. 30, 2015.
International Search Report and Written Opinion for PCT/KR2015/004139 dated Jun. 29, 2015.
International Search Report and Written Opinion for PCT/KR2015/005454 dated Aug. 25, 2015.
International Search Report and Written Opinion for PCT/KR2015/008212 dated Nov. 17, 2015.
Extended European Search Report for Application No. 15829073.4 dated May 22, 2018.
Extended European Search Report for Application No. 15839158.1 dated May 24, 2018.
Extended European Search Report for Application No. 15839164.9 dated May 22, 2018.
Extended European Search Report for Application No. 15840080.4 dated Jun. 6, 2018.
Office Action for U.S. Appl. No. 15/502,501 dated Jun. 29, 2018.
Office Action for U.S. Appl. No. 15/502,502 dated Jun. 29, 2018.
Office Action for U.S. Appl. No. 15/509,850 dated Dec. 3, 2018.
Final Office Action for U.S. Appl. No. 15/502,502 dated Feb. 7, 2019.
Office Action for U.S. Appl. No. 15/509,849 dated Mar. 21, 2019.

* cited by examiner

500 : 510, 520

400 : 410, 420
500 : 510, 520
700 : 710, 720

B-B'

POWER INDUCTOR AND METHOD FOR MANUFACTURING THE SAME

BACKGROUND

The present disclosure relates to a power inductor, and more particularly, to a power inductor that is capable of being prevented from being short-circuited with peripheral devices and a method for manufacturing the same.

A power inductor is generally provided on a power circuit such as a DC-DC converter provided in portable devices. The power inductor is being increasingly used instead of an existing wound type choke coil pattern due to the tendency toward the high frequency and miniaturization of the power circuit. Also, the power inductor is being developed for miniaturization, high current, and low resistance as small-sized and multifunctional the portable devices are required.

The power inductor may be manufactured in the form of a stacked body in which ceramic sheets formed of a plurality of ferrites or a low-k dielectric are stacked. Here, a metal pattern is form in a coil pattern shape on each of the ceramic sheets. The coil patterns formed on the ceramic sheets are connected to each other by a conductive via formed on each of the ceramic sheets and have a structure in which the coil patterns overlap each other in a vertical direction in which the sheets are stacked. Typically, a body of the power inductor is manufactured by using a magnetic material including a quaternary system of nickel, zinc, copper, and iron.

However, since the magnetic material has a saturation magnetization less than that of a metal material, it may be difficult to realize high current characteristics that are recently required for portable devices. Thus, since the body of the power inductor is formed of metal powder, the saturation magnetization may increase in comparison with a case in which the body is formed of a magnetic material. However, when the body is formed of a metal, a loss of material may increase due to an increase in loss of eddy current and hysteria in a high frequency. To reduce the loss of the material, a structure in which the metal powder is insulated from each other by using a polymer is being applied.

Accordingly, the power inductor has a structure in which a coil is provided in the body including metal powder and a polymer, and an external electrode is disposed on an outer portion of the body and connected to the coil. Here, the external electrode may be disposed on lower and upper portions of the body as well as two side surfaces that are opposite to each other.

The external electrode disposed on a bottom surface of the body of the power inductor is mounted on a printed circuit board (PCB). Here, the power inductor is mounted adjacent to a power management IC (PMIC). The PMIC has a thickness of approximately 1 mm, and also the power inductor has the same thickness as the PMIC. Since the PMIC generates a high frequency noise to affect peripheral circuits or devices, the PMIC and the power inductor are covered by a shield can formed of, for example, stainless steel. However, in the power inductor, since the external electrode is disposed on the upper portion of the power inductor, the power inductor may be short-circuited with the shield can.

Also, since the body of the power inductor is formed of the metal powder and the polymer, the power inductor may decrease in inductance due to an increase in temperature. That is, the power inductor increases in temperature by heat generated from portable devices to which the power inductor is applied. As a result, while the metal powder forming the body of the power inductor is heated, the inductance may decrease.

PRIOR ART DOCUMENTS

KR Patent Publication No. 2007-0032259

SUMMARY

The present disclosure provides a power inductor which is capable of preventing an external electrode from being short-circuited and a method for manufacturing the same.

The present disclosure also provides a power inductor which is capable of being prevented from being short-circuited with the shield can because an external electrode is not disposed on the body and a method for manufacturing the same.

The present disclosure also provides a power inductor which is capable of improving thermal stability to prevent inductance from decreasing.

In accordance with a first embodiment, a power inductor includes: a body; a base disposed in the body; a coil disposed on the base; a first external electrode connected to the coil, the first external electrode being disposed on first and second surfaces of the body, which are opposite to each other; and a second external electrode connected to the first external electrode, the second external electrode being disposed on a third surface of the body, which is adjacent to the first and second surfaces. The second external electrode may be mounted on a printed circuit board (PCB) and spaced apart from a central portion of the third surface of the body.

In accordance with a second embodiment, a power inductor includes: a body; a base disposed in the body; a coil disposed on the base; and external electrodes connected to the coil, the external electrodes being disposed from first and second surfaces, which are opposite to each other, to upper and lower portions of the body, respectively. Each of the external electrodes has a height less than the stepped portion on the upper portion of the body.

In accordance with a third embodiment, a power inductor includes: a body; a base disposed in the body; a coil disposed on the base; an external electrode disposed on a surface of the body; and a connection electrode disposed in the body and connecting the coil to the external electrode. The external electrode may be mounted on a PCB and spaced from a central portion of the body, and the external electrode may be grown from the connection electrode.

In accordance with first to third embodiments, the body may include metal powder, a polymer, and a thermal conductive filler.

The metal powder may include metal alloy powder including iron and have a surface coated with at least one of a magnetic material and an insulating material.

The thermal conductive filler may include at least one selected from the group consisting of MgO, AlN, and a carbon-based material and be contained in a content of approximately 0.5 wt % to approximately 3 wt %, based on approximately 100 wt % of the metal powder.

The base may be formed by bonding a copper foil to both surfaces of a metal plate including iron.

The power inductor may further include a magnetic layer disposed on at least one area of the body and having magnetic permeability higher than that of the body.

At least two bases may be provided, the coils may be respectively disposed on the at least two base, and the coils may be connected to each other by a side surface electrode disposed on a fourth surface of the body.

In accordance with a fourth embodiment, a method for manufacturing a power inductor, the method including: forming a coil on at least one base; forming a plurality of sheets including metal powder and a polymer; Stacking the plurality of sheets with the base therebetween to press the sheets, and then molding the sheets to form a body; forming a second external electrode on a surface of the body so as to be spaced a predetermined distance; and forming a first external electrode connected to the second external electrode on a side surface of the body.

The second external electrode may be disposed to be spaced a predetermined distance on a surface of the body and bonded to a copper foil, and then a plating process may be performed to grow a plated layer from the copper foil.

In accordance with a fifth embodiment, a method for manufacturing a power inductor, the method including: forming a coil on at least one base; forming a plurality of sheets including metal powder and a polymer, in which a hole is formed in a predetermined area thereof; stacking the plurality of sheets with the base therebetween, including the sheet, and then molding the sheets to form a passing hole exposing a predetermined area of the coil; filling the passing hole to form a connection electrode; forming an external electrode on a surface of the body and connecting the external electrode to the connection electrode.

The connection electrode may be formed by performing an electroless plating process to fill at least a portion of the passing hole and then performing an electroplating process to fill the passing hole. The external electrode may grow from the connection electrode by the electroplating process.

In accordance with fourth and fifth embodiments, the base may be formed by bonding the copper foil to at least one surface of the metal plate including iron, and the sheet may further include a thermal conductive filler.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Hereinafter, specific embodiments will be described in detail with reference to the accompanying drawings. The present disclosure may, however, be embodied in many different forms and should not be construed as being limited to the embodiments set forth herein. Rather, these embodiments are provided so that this disclosure will be thorough and complete, and will fully convey the concept of the invention to those skilled in the art.

Figure 1:
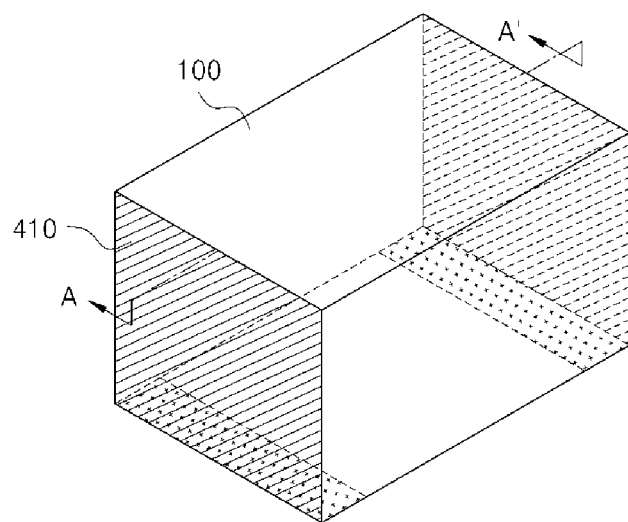
FIG. 1 is a perspective view of a power inductor in accordance with a first embodiment.
Figure 2:
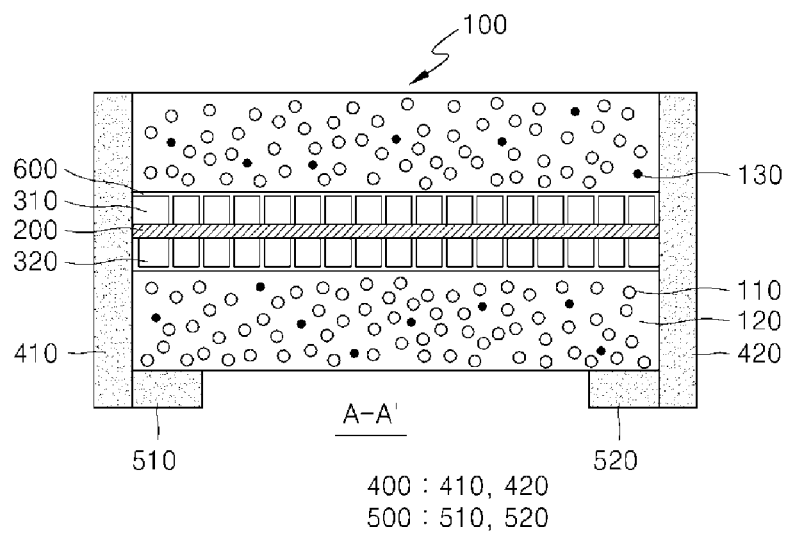
FIG. 2 is a cross-sectional view taken along line A-A' of FIG. 1.
Figure 3:
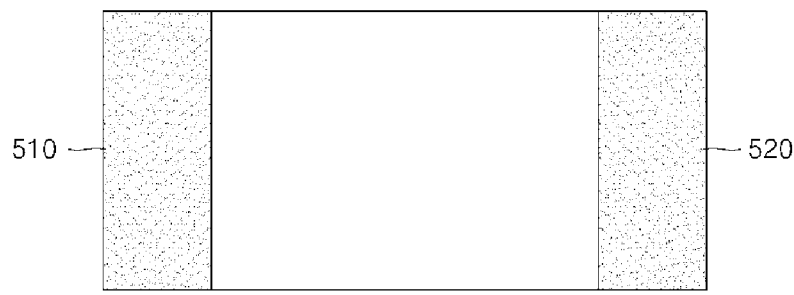
FIG. 3 is a plan view of a bottom surface of FIG. 1.

FIG. 1 is a perspective view of a power inductor in accordance with a first embodiment, FIG. 2 is a cross-sectional view taken along line A-A' of FIG. 1, and FIG. 3 is a plan view of a bottom surface of FIG. 1.

Referring to FIGS. 1 to 3, a power inductor in accordance with a first embodiment may include a body 100, at least one base 200 disposed in the body 100, coil patterns 300 (310 and 320) disposed on at least one surface of the base 200, first external electrodes 400 (410 and 420) disposed on two side surfaces of the body 100, which face each other, and respectively connected to the coil patterns 300 (310 and 320), and second external electrodes 500 (510 and 520) disposed spaced a predetermined distance from each other on a bottom surface of the body 100 and respectively connected to the first external electrodes 400 (410 and 420). Here, the body 100 has a bottom surface facing a PCB, on which the PCB is mounted, and a side surface disposed between the bottom surface and a top surface facing the bottom surface. Thus, the external electrode may not be disposed on the top surface of the body 100, and the first and second external electrodes 400 and 500 may be disposed on only the two side surfaces facing each other and bottom surface of the body 100.

The body 100 may have, for example, a hexahedral shape. The body 100, however, may have a polyhedral shape in addition to the hexahedral shape. The body 100 may include metal powder 110, polymer 120, and thermal conductive filler 130. The metal powder 110 may have a mean particle diameter of approximately 1 µm to approximately 50 µm. Also, the metal powder 110 may use a single kind of particles or at least two kinds of particles having the same size and a single kind of particles or at least two kinds of particles having a plurality of sizes. For example, a first metal particle having a mean size of approximately 30 µm and a second metal particle having a mean size of approximately 3 µm may be mixed with each other for using. When two kinds of metal powder 110 having sizes different from each other are used, the body 100 may increase in filling rate to maximize capacity. For example, when metal powder having a size of approximately 30 µm is used, a pore may be generated between the metal powder having the size of approximately 30 µm, resulting in decreasing the filling rate. However, since metal power having a size of approximately 3 µm is mixed between the metal power having the size of approximately 30 µm, the filling rate may further increase. The metal powder 110 may use a metal material including iron (Fe). For example, the metal powder 110 may include at least one metal selected from the group consisting of iron-nickel (Fe—Ni), iron-nickel-silica (Fe—Ni—Si), iron-aluminum-silica (Fe—Al—Si), and iron-aluminum-chrome (Fe—Al—Cr) That is, since the metal powder 110 includes the iron, the metal powder 110 may be formed as a metal alloy having a magnetic structure or magnetic property to have predetermined magnetic permeability. Also, a surface of the metal powder 110 may be coated with a magnetic material having magnetic permeability different from that of the metal powder 110. For example, the magnetic material may be formed with the metal oxide magnetic material. That is, the magnetic material may be formed of at least one oxide magnetic material selected from the group consisting of a nickel-oxide magnetic material, a zinc-oxide magnetic material, a copper-oxide magnetic material, a manganese-oxide magnetic material, a cobalt-oxide magnetic material, a barium-oxide magnetic material, and a nickel-zinc-copper oxide magnetic material. The magnetic material applied on the surface of the metal powder 110 may be formed of a metal oxide including iron and have the magnetic permeability greater than that of the metal powder 110. Furthermore, the surface of the metal powder 110 may be coated with at least one insulating material. For example, the surface of the metal powder 110 may be coated with an oxide and polymer such as parylene. The oxide may be formed by oxidizing the metal powder 110 or be coated with one selected from the group consisting of $TiO_2$, $SiO_2$, $ZrO_2$, $SnO_2$, NiO, ZnO, CuO, CoO, MnO, MgO, $Al_2O_3$, $Cr_2O_3$, $Fe_2O_3$, $B_2O_3$, and $Bi_2O_3$. Also, the surface of the metal powder 110 may be coated by using various insulating polymer materials in addition to the parylene. Here, the metal powder 110 may be coated with oxide having a double-layered structure or a double-layered structure of oxide and polymer materials. Alternatively, the surface of the metal powder 110 may be coated with the magnetic material and then the insulating material. As described above, the surface of the metal powder 110 may be coated with the insulating material to prevent a short-circuit due to the contact of the metal powder 110 from occurring. The polymer 120 may be mixed with the metal powder 110 so that the metal powder 110 is insulated with each other. That is, the metal powder 110 may increase in loss of eddy current and hysteria in a high frequency to cause a loss of the material. To reduce the loss of the material, the polymer 120 may be provided to insulate the metal powder 110 from each other. Although the polymer 120 is selected from the group consisting of epoxy, polyimide, and a liquid crystalline polymer (LCP), the present disclosure is not limited thereto. The polymer 120 may include a thermosetting resin to give an insulation property to the metal powder 100. The thermosetting resin may include at least one selected from the group consisting of a novolac epoxy resin, a phenoxy type epoxy resin, a BPA type epoxy resin, a BPF type epoxy resin, a hydrogenated BPA epoxy resin, a dimer acid modified epoxy resin, a urethane modified epoxy resin, a rubber modified epoxy resin, and a DCPD type epoxy resin. Here, the polymer 120 may be contained in a content of approximately 2.0 wt % to approximately 5.0 wt %, based on 100 wt % of the metal powder. When the polymer 120 increases in content, a volume fraction of the metal powder 110 may decrease, and thus, it may be difficult to properly realize an effect for increasing the saturation magnetization, and the magnetic characteristics of the body 100, i.e., the magnetic permeability may decreases. When the polymer 120 decreases in content, a strong acid or strong alkaline solution used in a process for manufacturing the inductor may be permeated into the inductor to reduce the inductance characteristics. Thus, the polymer 120 may be contained within a range in which the saturation magnetization and inductance of the metal powder 110 do not decrease. Also, the thermal conductive filler 130 may be provided to solve the limitation in which the body 100 is heated by the external heat. That is, when the metal powder 110 of the body 100 is heated by the external heat, the thermal conductive filler 130 may release the heat of the metal powder 110 to the outside. Although the thermal conductive filler 130 includes at least one selected from the group consisting of MgO, AlN, and a carbon-based material, the present disclosure is not limited thereto. Here, the carbon-based material may include carbon and have various shapes. For example, the carbon-based material may include graphite, carbon black, graphene, graphite, and the like. Also, the thermal conductive filler 130 may be contained in a content of approximately 0.5 wt % to approximately 3 wt %, based on approximately 100 wt % of the metal powder 110. When the content of the thermal conductive filler 130 is below the above-described range, a heat dissipation effect may not be achieved. On the other hand, when the content of the thermal conductive filler 130 is above the above-described range, the magnetic permeability of the metal powder 110 may decrease. Also, the thermal conductive filler 130 may have, for example, a size of approximately 0.5 μm to approximately 100 μm. That is, the thermal conductive filler 130 may have a size greater or less than that of the metal powder 110. On the other hand, the body 100 may be manufactured by stacking a plurality of sheets formed of a material including the metal powder 110, the polymer 120, and the thermal conductive filler 130. Here, when the body 100 is manufactured by stacking the plurality of sheets, the thermal conductive fillers 130 in the sheets may have contents different from each other. For example, the more thermal filters are away from the base 200 upward and downward, the content of the thermal conductive fillers 130 in the sheets may gradually increase in content Also, as necessary, the body 100 may be formed by applying various processes such as a process of printing paste formed of a material including the metal powder 110, the polymer 120, and the thermal conductive filler 130 at a predetermined thickness or a process of filling the paste into a frame to compress the paste. Here, the number of sheets stacked for forming the body 100 or a thickness of the paste printed at the predetermined thickness may be determined to adequate number or thickness in consideration of electrical characteristics such as the inductance required for the power inductor.

At least one base 200 may be provided in the body 100. For example, the base 200 may be provided in the body 100 in a longitudinal direction of the body 100. Here, at least one base 200 may be provided. For example, two bases 200 may be provided in a direction perpendicular to a direction in which the external electrode 400 is disposed, for example, be spaced a predetermined distance from each other in a vertical direction. The base 200, for example, may be formed of copper clad lamination (CCL), a metal magnetic material, or the like. Here, the base 200 is formed of the magnetic material to improve the magnetic permeability and easily realize the capacity. That is, the CCL is manufactured by bonding a copper foil to glass reinforced fiber. Thus, the CCL may not have the magnetic permeability to reduce the magnetic permeability of the power inductor. However, when the metal magnetic material is used as the base 200, the magnetic permeability of the power inductor may not be reduced because the metal magnetic material has the magnetic permeability. The base 200 using the metal magnetic material may be manufactured by bonding the copper foil to a plate that has a predetermined thickness and is formed of at least one metal selected from the group consisting of metal including iron such as, for example, iron-nickel (Fe—Ni), iron-nickel-silica (Fe—Ni—Si), iron-aluminum-silica (Fe—Al—Si), and iron-aluminum-chrome (Fe—Al—Cr). That is, an alloy formed of at least one metal including iron may be manufactured in the form of a plate having a predetermined thickness, and then the copper foil may be bonded to at least one surface of the metal plate to manufacture the base 200. Also, at least one conductive via (not shown) may be formed in a predetermined area of the base 200, and the coil patterns 310 and 320 respectively disposed on the upper and lower portions of the base 200 may be electrically connected to each other by the conductive via. The via (not shown) passing in a direction of a thickness of the base 200 may be formed, and then the conductive paste may be filled into the via to form the conductive via.

The coil patterns 310 and 320 may be disposed on at least one surface, preferably, both surfaces of the base 200. The coil patterns 310 and 320 may be disposed on a predetermined area of the base 200, e.g., disposed outward from a central portion thereof in a spiral shape, and the two coil patterns 310 and 320 disposed on the base 200 may be connected to form one coil. Here, the coil patterns 310 and 320 on the upper and lower portions may have the same shape. Also, the coil patterns 310 and 320 may overlap each other. Alternatively, the coil pattern 320 may overlap each other on an area in which the coil pattern 310 is not formed. The coil patterns 310 and 320 may be electrically connected by the conductive via disposed in the base 200. The coil patterns 310 and 320 may be formed by a method such as, for example, screen printing, coating, deposition, plating, or sputtering. Although each of the coil patterns 310 and 320 and the conductive via is formed of a material including at least one of silver (Ag), copper (Cu), and copper alloy, the present disclosure is not limited thereto. On the other hand, when the coil patterns 310 and 320 are formed through the plating process, the metal layer, for example, a copper layer may be formed on the base 200 by the plating process and then be patterned by a lithography process. That is, the copper layer may be formed by using the copper foil disposed on a surface of the base 200 as a seed layer through the plating process and then be patterned to form the coil patterns 310 and 320. Alternatively, a photosensitive film pattern having a predetermined shape may be formed on the base 200, and the plating process may be performed to grow the metal layer from the exposed surface of the base 200, and then the photosensitive film may be removed to form the coil patterns 310 and 320 having a predetermined shape. Alternatively, the coil patterns 310 and 320 may be formed in a multi-layered shape That is, a plurality of coil patterns may be further formed upward from the coil patterns 310 formed on the upper portion of the base 200, and a plurality of coil patterns may be further formed downward from the coil patterns 320 formed on the lower portion of the base 200. When the coil patterns 310 and 320 are formed in the multi-layered shape, an insulation layer may be formed between lower and upper layers, and a conductive via (not shown) may be formed in the insulation layer to connect the multi-layered coil patterns to each other.

First external electrodes 400 (410 and 420) may be disposed on both ends of the body 100, respectively. For example, the first external electrodes 400 may be disposed on both side surfaces facing each other in the longitudinal direction of the body 100. The first external electrodes 410 and 420 may be electrically connected to the coil patterns 310 and 320 disposed on the base 200. That is, at least ends of the coil patterns 310 and 320 may be respectively exposed to the outside of the body 100 in directions opposite to each other, and the first external electrode 410 and 420 may be respectively connected to the exposed ends of the coil patterns 310 and 320. The first external electrodes 410 and 420 may be disposed on both ends of the body 100 by dipping the body 100 into the conductive paste or through the various processes such as the printing, the deposition, and the sputtering. Here, when the first external electrodes 410 and 420 are coated with the conductive paste, a side surface of the body 100 is not dipped up to a predetermined depth, and the conductive paste is applied on only the side surface of the body 100. Also, the first external electrodes 410 and 420 may be patterned by using lithography and etching processes, if necessary. The first external electrodes 410 and 420 may be disposed of an electro-conductive metal. For example, the first external electrodes may be formed of at least one metal selected from the group consisting of gold, silver, platinum, copper, nickel, palladium, and an alloy thereof. Also, a nickel plated layer (not shown) or a tin plated layer (not shown) may be further disposed on a surface of the first external electrode 410 and 420. For example, only the side surface of the body 100 may contact the conductive paste to perform a plating process, thereby forming the first external electrodes 410 and 420.

The second external electrodes 500 (510 and 520) may be disposed to be spaced apart from each other on a bottom surface of the body 100. The second external electrodes 510 and 520 may be connected to the first external electrodes 410 and 420 disposed on the side surface of the body 100, respectively. Thus, the second external electrodes 510 and 520 may be connected to the coil within the body 100 through the first external electrodes 410 and 420. The second external electrodes 510 and 520 may be formed on the bottom surface of the body 100 by dipping the bottom surface of the body 100 into the conductive paste or through various methods such as printing, deposition, and sputtering. Here, as necessary, a patterning process may be performed. For example, when the second external electrodes 510 and 520 are formed by dipping the bottom surface of the body 100 into the conductive paste or through the printing process, the deposition process, or sputtering process, a conductive layer may be formed over the entire bottom surface of the body 100, and the lithography and etching processes may be performed to pattern the conductive layer so that a central portion of the conductive layer is spaced. Alternatively, the second external electrodes 510 and 520 may be formed by forming a seed layer on only an edge of the bottom surface of the body 100 to perform the plating process without performing the patterning process. For this, a copper foil may be formed on the edge of the bottom surface of the body 100 as the seed layer, and then the plating process may be performed to form the second external electrodes 510 and 520. Thus, the second external electrodes 510 and 520 may be formed with a stacked structure of the seed layer and the plated layer. Alternatively, the second external electrodes 510 and 520 may be formed of electro-conductive metal. For example, the second external electrodes 510 and 520 may be formed of at least one metal selected from the group consisting of gold, silver, platinum, copper, nickel, palladium, and an alloy thereof. Also, a nickel plated layer (not shown) or a tin plated layer (not shown) may be further formed on a surface of the second external electrode 510 and 520.

Alternatively, an insulation layer 600 may be further formed between the coil patterns 310 and 320 and the body 100 to insulate the coil patterns 310 and 320 from the metal powder 110. That is, the insulation layer 600 may be formed on the upper and lower portions of the base 200 to cover the coil patterns 310 and 320. The insulation layer 600 may include at least one material selected from the group consisting of epoxy, polyimide, and a liquid crystalline polymer. That is, the insulation layer 600 may be formed of the same material as the polymer 120 forming the body 100. Also, the insulation layer 600 may be formed by applying an insulating polymer material such as parylene on the coil patterns 310 and 320. That is, the insulation layer 600 may be coated at a uniform thickness along stepped portions of the coil patterns 310 and 320. Alternatively, the insulation layer 600 may be formed on the coil patterns 310 and 320 by using the insulation sheet.

As described above, in the power inductor in accordance with an exemplary embodiment, the second external electrodes 510 and 520 are disposed on the bottom surface of the body 100, which faces the PCB, and the first external electrodes 410 and 420 are disposed on the side surface of the body 100, which is adjacent to the bottom surface. Since the external electrode is not disposed on the body 100, a short-circuit between a shield can and the power inductor may be prevented. The body 100 may include the metal powder 110, the polymer 120, and the thermal conductive filler 130. The heat of the body 100, which is generated by heating of the metal powder 110, may be released to the outside to prevent the body 100 from increasing in temperature, and thus, prevent the inductance from being reduced. Also, the base 200 inside the body 100 may be formed of the magnetic material to prevent the power inductor from being reduced in magnetic permeability.

Figure 4:
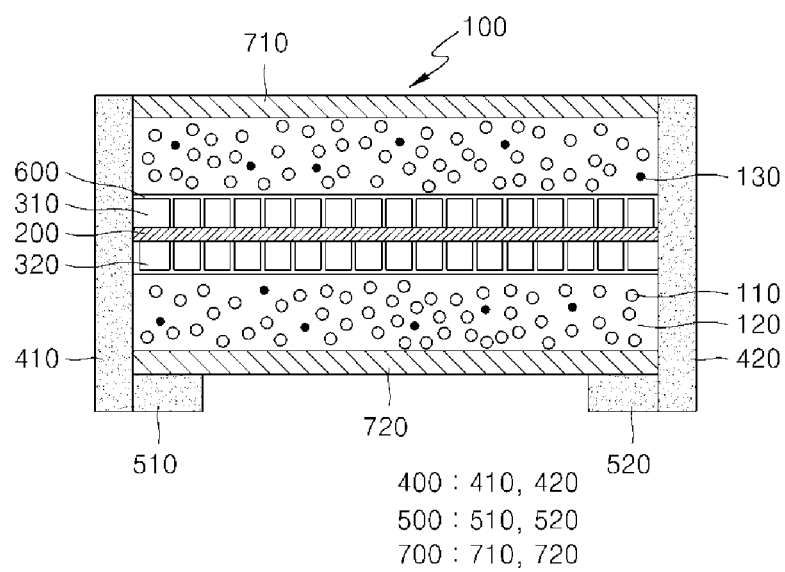
FIGS. 4 to 6 are cross-sectional views of a power inductor in accordance with a second embodiment.

FIG. 4 is a cross-sectional view of a power inductor in accordance with a second embodiment.

Referring to FIGS. 4 to 3, the power inductor in accordance with a second embodiment may include a body 100, at least two bases 200 disposed in the body 100, coil patterns 300 (310, and 320) respectively disposed on at least one surface of each of at least one base 200, first external electrodes 400 (410 and 420) respectively disposed on side surfaces of the body 100, which face each other, and respectively connected to the coil patterns 310 and 320, second external electrodes 500 (510 and 520) disposed to be spaced a predetermined distance from each other on the a bottom surface of the body 100 and respectively connected to the first external electrodes 400 (410 and 420), and at least one magnetic layer 710 and 720 disposed on each of upper and lower portions of the body 100. Also, the power inductor may further include an insulation layer 600 provided on each of the coil pattern 300.

A magnetic layer 700 (710 and 720) may be provided to at least one area of a body 100. That is, a first magnetic layer 710 may be disposed on a top surface of the body 100, and a second magnetic layer 720 may be disposed on a bottom surface of the body 100. Here, the first and second magnetic layers 710 and 720 may be provided to increase magnetic permeability of the body 100 and be formed of a material having magnetic permeability higher than that of the body 100. For example, the body 100 may have magnetic permeability of approximately 20, and each of the first and second magnetic layers 710 and 720 may have magnetic permeability of approximately 40 to approximately 1000. The first and second magnetic layers 710 and 720 may be formed of, for example, magnetic powder and a polymer. That is, the first and second magnetic layers 710 and 720 may be formed of a material having magnetism higher than that of the magnetic material of the body 100 or have a content of the magnetic material, which is higher than that of the magnetic material of the body 100 so that each of the first and second magnetic layers 710 and 720 has the magnetic permeability higher than that of the body 100. Here, the polymer may be contained in a content of approximately 15 wt %, based on approximately 100 wt % of the metal powder. Also, the magnetic material powder may use at least one selected from the group consisting of a nickel magnetic material (Ni Ferrite), a zinc magnetic material (Zn Ferrite), a copper magnetic material (Cu Ferrite), a manganese magnetic material (Mn Ferrite), a cobalt magnetic material (Co Ferrite), a barium magnetic material (Ba Ferrite), and a nickel-zinc-copper magnetic material (Ni—Zn—Cu Ferrite) or at least one oxide magnetic material thereof. That is, the magnetic layer 700 may be formed by using a metal alloy powder including iron or a metal alloy oxide including iron. Also, the magnetic powder may be formed by applying the magnetic material to the metal alloy powder. For example, the magnetic material powder may be formed by applying at least one magnetic material oxide selected from the group consisting of a nickel-oxide magnetic material, a zinc-oxide magnetic material, a copper-oxide magnetic material, a manganese-oxide magnetic material, a cobalt-oxide magnetic material, a barium-oxide magnetic material, and a nickel-zinc-copper oxide magnetic material to, for example, the metal alloy powder including iron. That is, the magnetic material powder may be formed by applying the metal oxide including iron to the metal alloy powder. Alternatively, the magnetic material powder may be formed by mixing at least one magnetic material oxide selected from the group consisting of a nickel-oxide magnetic material, a zinc-oxide magnetic material, a copper-oxide magnetic material, a manganese-oxide magnetic material, a cobalt-oxide magnetic material, a barium-oxide magnetic material, and a nickel-zinc-copper oxide magnetic material with, for example, the metal alloy powder including iron. That is, the magnetic material powder may be formed by mixing the metal oxide including iron with the metal alloy powder. On the other hand, each of the first and second magnetic layers 710 and 720 may further include the thermal conductive fillers in addition to the metal powder and polymer. The thermal conductive fillers may be contained in a content of approximately 0.5 wt % to approximately 3 wt %, based on approximately 100 wt % of the metal powder. The first and second magnetic layers 710 and 720 may be manufactured in a sheet shape and respectively disposed on upper and lower portions of the body 100 on which a plurality of sheets are stacked. Also, the body 100 may be formed by printing a paste formed of a material including metal powder 110, a polymer 120, and a thermal conductive filler 130 at a predetermined thickness or filling the paste into a frame to compress the paste, and then the first and second magnetic layers 710 and 720 may be respectively disposed on the upper and lower portions of the body 100. Alternatively, the magnetic layer 710 and 720 may be formed by using the paste, i.e., formed by applying the magnetic material to the upper and lower portions of the body 100.

Figure 5:
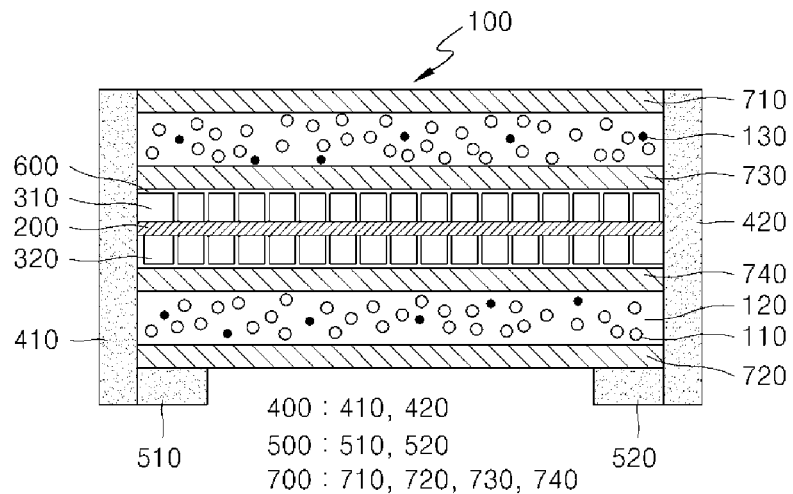
Figure 6:
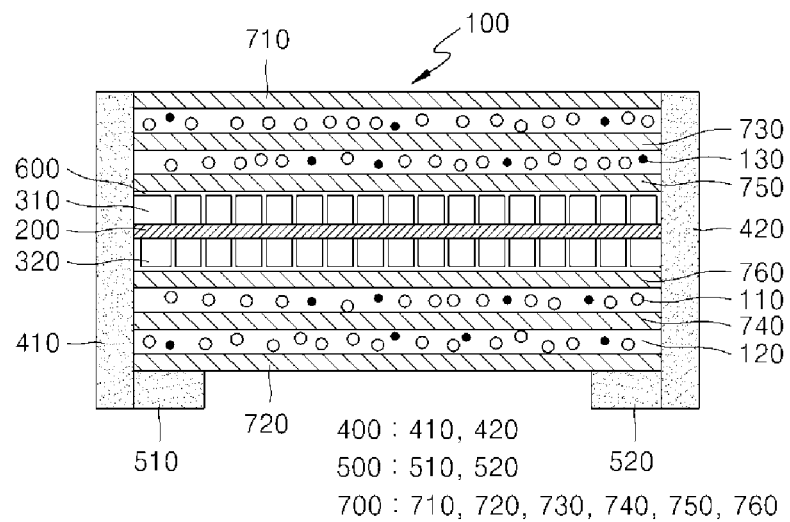

The power inductor in accordance with a second embodiment may further include third and fourth magnetic layers 730 and 740 on the upper and lower portions between the body 100 and at least two bases 200 as illustrated in FIG. 5, and fifth and sixth magnetic layers 750 and 760 may be further provided therebetween as illustrated in FIG. 6. That is, at least one magnetic layer 700 may be provided in the body 100. The magnetic layers 700 may be manufactured in a sheet shape and provided in the body 100 in which a plurality of sheets are stacked. That is, at least one magnetic layer 700 may be provided between the plurality of sheets for manufacturing the body 100. Also, when the body 100 is formed by printing the paste formed of the material including the metal powder 110, the polymer 120, and the thermal conductive filler 130 at a predetermined thickness, the magnetic layer may be formed during the printing. Also, when the body 100 is formed by filling the paste into the frame to compress the paste, the magnetic layer may be inserted therebetween to compress the paste. Alternatively, the magnetic layer 700 may be formed by using the paste, i.e., formed in the body 100 by applying a soft magnetic material during the printing of the body 100.

As described above, the power inductor in accordance with another exemplary embodiment may include the at least one magnetic layer 700 in the body 100 to improve the magnetism of the power inductor.

Figure 7:
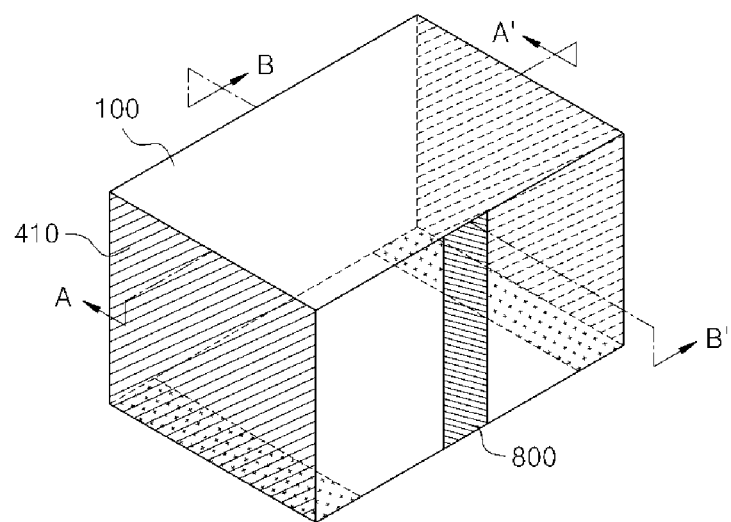
FIG. 7 is a perspective view of a power inductor in accordance with a third embodiment.
Figure 8:
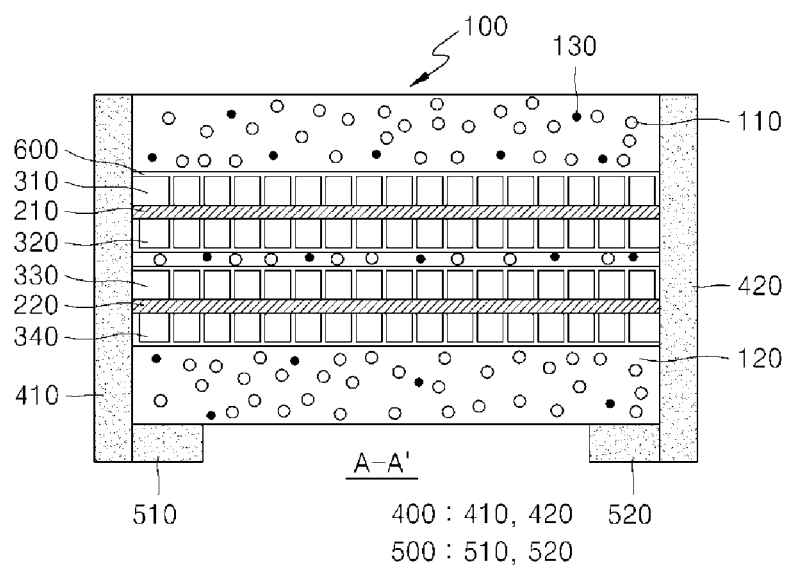
FIGS. 8 and 9 are cross-sectional views taken along lines A-A' and B-B' of FIG. 9, respectively.
Figure 9:
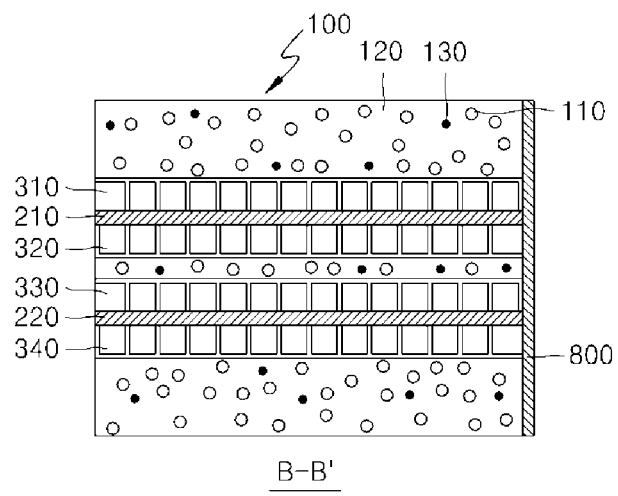

FIG. 7 is a perspective view of a power inductor in accordance with a third embodiment, FIG. 8 is a cross-sectional view taken along line A-A' of FIG. 7, and FIG. 9 is a cross-sectional view taken along line B-B' of FIG. 7.

Referring to FIGS. 7 to 9, a power inductor in accordance with a third embodiment may include a body 100, at least two bases 200 disposed in the body 100, coil patterns 300 (310 and 320) disposed on at least one surface of each of at least one base 200, first external electrodes 400 (410 and 420) respectively disposed on side surfaces of the body 100, which are opposite to each other, and respectively connected to the coil patterns 300 (310 and 320), and second external electrodes 500 (510 and 520) disposed on the a bottom surface of the body 100, spaced a predetermined distance from each other, and respectively connected to the first external electrodes 400 (410 and 420), and a side surface electrode 800 disposed on an outer portion of the body 100, spaced from the external electrodes 400 and 500, and connected to at least one coil pattern 300 disposed on each of at least two bases 200 in the body 100

At least two bases 200 (210 and 220) may be provided in the body 100. For example, at least two bases 200 may be provided in the body 100 along a longitudinal direction of the body 100 and spaced a predetermined distance in a direction of a thickness of the body 100. The base 200 may be formed of, e.g., copper clad lamination (CCL), a metal magnetic material, or the like, preferably, may be formed of the metal magnetic material.

The coil patterns 300 (310, 320, 330, and 340) may be formed on at least one surface, preferably, both surfaces of each of the at least bases 200. Here, the coil patterns 310 and 320 may be respectively disposed on upper and lower portions of the first base 210 and electrically connected by the conductive via formed in the first base 210. Similarly, the coil patterns 330 and 340 may be respectively disposed on upper and lower portions of the second base and electrically connected by the conductive via formed in the second base 220. That is, at least two coils may be provided in one body 100. Here, the coil patterns 310 and 330 on the upper portion of the base 200 and the coil patterns 320 and 340 on the lower portion of the base 200 may have the same shape. Also, the plurality of coil patterns 300 may overlap each other. Alternatively, the coil patterns 320 and 340 on the lower portion may overlap each other on an area in which the coil patterns 310 and 330 on the upper portion are not formed. The plurality of coil patterns 300 may be formed through a method such as, e.g., screen printing, coating, deposition, plating, or sputtering.

The side surface electrode 800 may be disposed on one side surface of the body 100 on which the first external electrode 400 is not disposed. The side surface electrode 800 is provided to connect at least one of the coil patterns 310 and 320 disposed on the first base 210 to at least one of the coil patterns 330 and 340 disposed on the second base 220. Thus, the coil patterns 310 and 320 formed on the first base 210 and the coil patterns 330 and 340 disposed on the second base 220 may be electrically connected to each other by the side surface electrode 800 disposed on an outer portion of the body 100. The side surface electrodes 800 may be formed on one side surface of the body 100 by dipping the body 100 into the conductive paste or through various methods such as printing, deposition, and sputtering. The side surface electrode 800 may be formed of metal that is capable of giving electric conductivity. For example, the side surface electrode may include at least one metal selected from the group consisting of gold, silver, platinum, copper, nickel, palladium, and an alloy thereof. Here, as necessary, a nickel plated layer (not shown) or a tin plated layer (not shown) may be further formed on a surface of the side surface electrode 800.

As described above, in the power inductor in accordance with further another exemplary embodiment, at least two bases 200, each of which has at least one surface on which the coil patterns 300 is disposed, may be provided in the body 100 and be connected to each other by the side surface electrode 800 disposed on the outer portion of the body 100 to form the plurality of coils in one body 100, thereby increasing the capacity of the power inductor.

Figure 10:
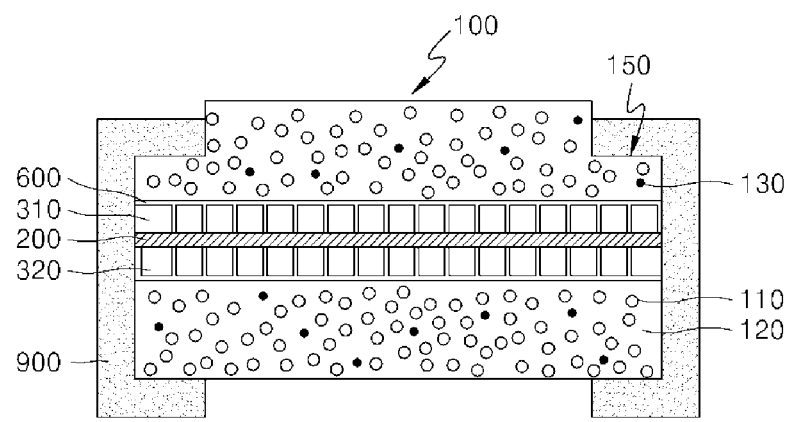
FIG. 10 is a perspective view of a power inductor in accordance with a fourth embodiment.

FIG. 10 is a cross-sectional view of a power inductor in accordance with a fourth embodiment.

Referring to FIG. 10, the power inductor in accordance with a fourth embodiment may include a body 100 on which a stepped portion 150 is formed on at least one area on a top surface thereof, at least one base 200 disposed in the body 100, coil patterns 300 (310 and 320) disposed on at least one surface of the at least one base 200, and external electrodes 900 disposed on two surface of the body 100, which face each other, and respectively connected to the coil patterns 310 and 320. Although the external electrodes 400 and 500 are not disposed on the top surface of the body 100 in the foregoing exemplary embodiments described with reference to FIGS. 1 to 9, the stepped portion 150 may be disposed on the top surface of the body 100 so that the external electrode 900 on the upper portion of the body 100 does not contact a shield can or the like even when the external electrode 900 is disposed on the body 100 in accordance with further another exemplary embodiment in FIG. 10. Since the stepped portion 150 is formed at a height greater than a thickness of the external electrode 900 disposed on the body 100, the external electrode 900 may not contact the shield can even when the external electrode 900 is provided. Also, since the stepped portion 150 is formed on the body 100, the two side surfaces of the body 100, which face each other, may be dipped into conductive paste up to a depth corresponding to the height of the stepped portion 150 to form the external electrode 900 from a bottom surface to side and top surfaces of the body 100. Thus, a process for forming the external electrode 900 may be simplified.

Figure 11:
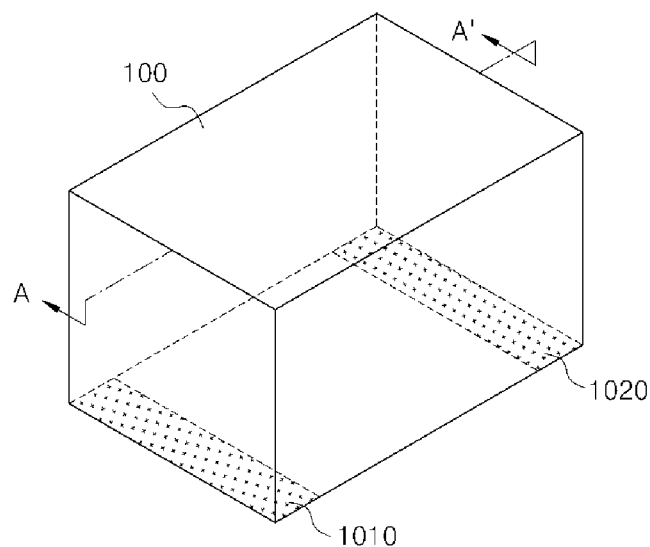
FIG. 11 is a perspective view of a power inductor in accordance with a fifth embodiment.
Figure 12:
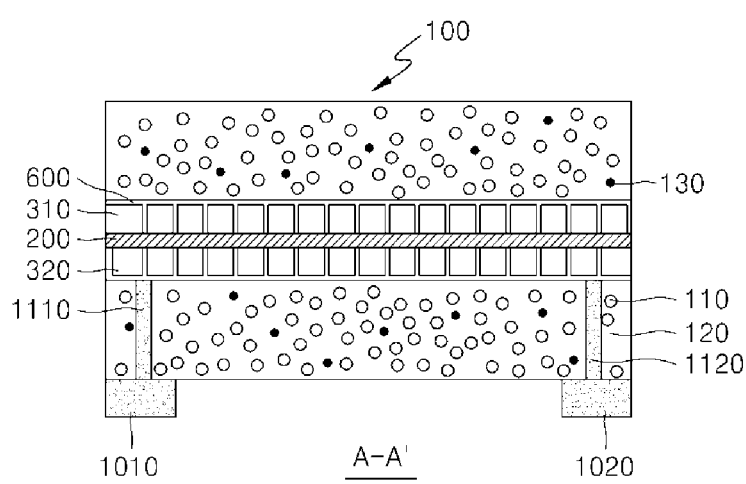
FIG. 12 is a cross-sectional view taken along line A-A' of FIG. 1.
Figure 13:
FIG. 13 is a plan view of the bottom surface of FIG. 1.

FIG. 11 is a perspective view of a power inductor in accordance with a fifth embodiment, FIG. 12 is a cross-sectional view taken along line A-A' of FIG. 5, and FIG. 13 is a plan view of a bottom surface of FIG. 11.

Referring to FIGS. 11 to 13, the power inductor in accordance with a fifth embodiment may include a body 100, at least one base 200 disposed in the body 100, coil patterns 300 (310 and 320) disposed on at least one surface of the at least one base 200, external electrodes 1000 (1010 and 1020) disposed to be spaced a predetermined distance from each other on a bottom surface of the body 100, and connection electrodes 1100 (1110 and 1120) disposed in the body 100 to connect the coil patterns 300 to the external electrodes 1000. Here, the body 100 has a bottom surface facing a PCB, on which the PCB is mounted. In accordance with an exemplary embodiment, the external electrode 1000 may not be disposed on a top surface of the body 100, but be disposed on only the bottom surface of the body 100.

The external electrodes 1000 (1010 and 1020) may be disposed to be spaced apart from each other on the bottom surface of the body 100. The external electrodes 1010 and 1020 may be connected to the connection electrodes 1100 (1120 and 1110) disposed in the body 100, respectively. Thus, the external electrodes 1010 and 1020 may be connected to the coil in the body 100 through the connection electrodes 1110 and 1120. The external electrodes 1010 and 1020 may be formed by dipping the bottom surface of the body 100 into conductive paste or through various methods such as printing, deposition, and sputtering. As necessary, the external electrodes 1010 and 1020 may be patterned by using lithography and etching processes. A conductive layer may be formed on the bottom surface of the body 100 by using the predetermined method and then removed by a predetermined width to form the external electrodes 1010 and 1020 at a predetermine width from an edge of the bottom surface of the body 100. Also, the external electrodes 1010 and 1020 may be grown from the connection electrodes 1110 and 1120, respectively. That is, the connection electrodes 1110 and 1020 may be formed by using a plating process, and thus, the external electrodes 1010 and 1020 may be formed from the connection electrodes. For example, an electroless plating process may be performed to form a portion of each of the connection electrodes 1110 and 1120, and an electroplating process may be performed to from the connection electrodes 1110 and 1120 from the coil pattern 320, thereby forming the external electrodes 1010 and 1020. Alternatively, the external electrode 1010 and 1020 may be formed of electro-conductive metal. For example, the external electrodes 1010 and 1020 may be formed at least one metal selected from the group consisting of gold, silver, platinum, copper, nickel, palladium, and an alloy thereof. Also, a nickel plated layer (not shown) or a tin plated layer (not shown) may be further formed on a surface of the external electrodes 1010 and 1020.

The connection electrodes 1100 (1110 and 1120) may be disposed in the body 100 to connect the coil patterns 310 and 320 to the external electrodes 1010 and 1020. That is, at least two connection electrodes 1100 may be disposed on a predetermined area on the bottom surface of the body 100. For example, a hole may be defined in a predetermined area of the body 100 to allow the coil pattern 320 disposed on the lower portion of the base 200 to be exposed, and a conductive material may be filled into the hole to form the connection electrode 1110. The connection electrode 1100 may be formed by filling the conductive material in the hole formed in the body 100 through the electroless plating and electroplating processes. Also, the external electrode 1000 may be formed from the connection electrode 1100. For example, the connection electrode 1100 may be filled into the hole of the body 100 and then electro-plated to grow a conductive layer on the bottom surface of the body 100 from the connection electrode 1100. Then, the conductive layer may be patterned to form the external electrodes 1010 and 1020. That is, the external electrodes 1010 and 1020 may be formed through the electroplating process using the connection electrode 1100 as a seed layer. Here, the hole for forming the connection electrode 1100 may be formed by etching a predetermined area of the body 100 to expose at least one of the coil patterns 310 and 320 after the body 100 is formed. For example, the hole may be formed by punching a predetermined area of the body 100 using laser. Also, when the body 100 is formed by using a mold, the mold that is capable of forming a hole in a predetermined area may be used. When a plurality of sheets are used to form the body 100, the plurality of sheets each of which has a hole in a predetermined area may be stacked to form the hole.

In accordance with a fifth embodiment, at least one magnetic layer 700 may be provided in the body 100 as described in the second embodiment. Also, as described in the third embodiment, at least two bases 200 may be provided, the coil patterns 300 (310 and 320) may be disposed on at least one surface of each of the at least two bases 200, and the plurality of coil patterns 300 may be connected by the connection electrode 800 disposed on the outer surface of the body 100.

As above-described, in the power inductor in accordance with the fifth embodiment, the external electrodes 1010 and 1020 may be disposed on the bottom surface of the body 100, which faces the PCB, and the connection electrodes 1110 and 1120 may be disposed in the body 100 to connect the coil patterns 310 and 320 to the external electrodes 1010 and 1020. Since the external electrode is not disposed on the body 100, the short-circuit between the shield can and the power inductor may be prevented.

FIGS. 14 to 17 are cross-sectional views sequentially illustrating a method for manufacturing the power inductor in accordance with the first embodiment.

Figure 14:
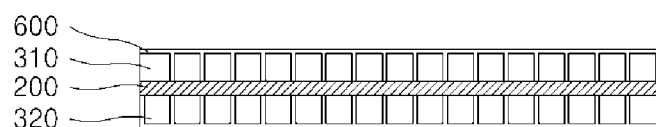
FIGS. 14 through 17 are views illustrating a method for manufacturing the power inductor in accordance with the first embodiment.

Referring to FIG. 14, coil patterns 310 and 320 each of which has a predetermined shape are formed on at least one surface, preferably, both surfaces of a base 200. The base 200 may be formed of CCL, a metal magnetic material, or the like. Here, the metal magnetic material that is capable of improving effective magnetic permeability and easily realizing capacity may be used. For example, the base 200 may be manufactured by bonding a copper foil to both surfaces of a metal plate which is formed of a metal alloy including iron and has a predetermined thickness. Also, the coil patterns 310 and 320 may be formed on a predetermined area of the base 200, e.g., may be formed as a coil pattern that is formed from a central portion thereof in a circular spiral shape. Here, the coil pattern 310 may be formed on one surface of the base 200, and then a conductive via passing through a predetermined area of the base 200 and in which a conductive material is filled therein may be formed. Also, the coil pattern 320 may be formed on the other surface of the base 200. The conductive via may be formed by filling conductive paste into a via hole after the via hole is formed in a thickness direction of the base 200 by using laser. For example, the coil pattern 310 may be formed through a plating process. For this, a photosensitive pattern having a predetermined shape may be formed on one surface of the base 200 to perform the plating process using a copper foil as a seed on the base 200. Then, a metal layer may be grown from the exposed surface of the base 200, and then the photosensitive film may be removed Alternatively, the coil patterns 320 may be formed on the other surface of the base 200 by using the same manner as that for forming the coil pattern 310. Alternatively, the coil patterns 310 and 320 may be formed in a multi-layered shape. When the coil patterns 310 and 320 are formed in the multi-layered shape, an insulation layer may be formed between lower and upper layers, and the conductive via (not shown) may be formed in the insulation layer to connect the multi-layered coil patterns to each other. The coil patterns 310 and 320 are formed on one surface and the other surface of the base 200, respectively, and then the insulation layer 500 is formed to cover the coil patterns 310 and 320. The insulation layer 500 may be formed by closely attaching a sheet including at least one material selected from the group consisting of epoxy, polyimide, and a liquid crystal crystalline polymer to the coil patterns 310 and 320.

Figure 15:
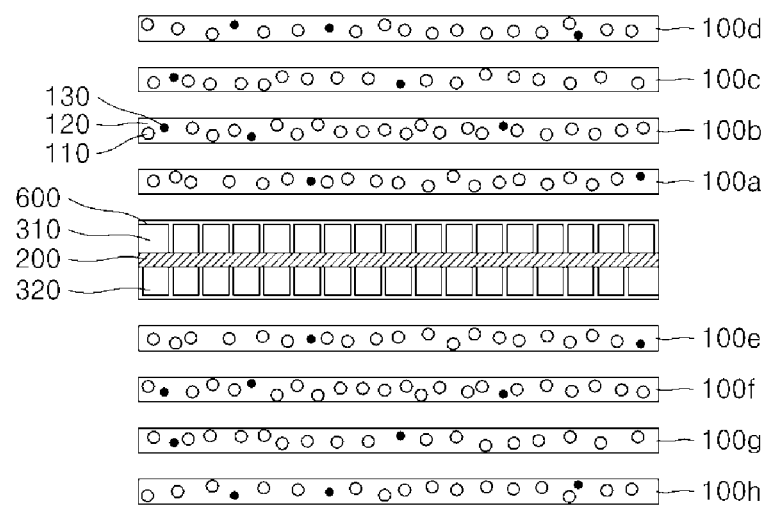

Referring to FIG. 15, a plurality of sheets 100a to 100h formed of a material including the metal powder 110, the polymer 120, and the thermal conductive filler 130 are provided. Here, the metal powder 110 may use a metal material including iron (Fe), and the polymer 120 may use epoxy, polyimide, or the like, which is capable of insulating the metal powder 110 from each other. Also, the thermal conductive filler 130 may use MgO, AlN, a carbon based material, or the like, which is capable of releasing heat of the metal powder 110 to the outside. Also, the surface of the metal powder 110 may be coated with a magnetic material, for example, a metal oxide magnetic material. Here, the polymer 120 may be contained in a content of approximately 2.0 wt % to approximately 5.0 wt %, based on 100 wt % of the metal powder 110, and the thermal conductive fillers 130 may be contained in a content of approximately 0.5 wt % to approximately 3.0 wt %, based on 100 wt % of the metal powder 110. The plurality of sheets 100a to 100h are disposed on the upper and lower portions of the base 200 on which the coil patterns 310 and 320 are formed, respectively. Here, the plurality of sheets 100a to 100h may have contents of thermal conductive fillers 130, which are different from each other. For example, the thermal conductive fillers 130 may have contents that gradually increase from one surface and the other surface of the base 200 toward the upper and lower sides of the base 200. That is, the thermal conductive filters 130 of the sheets 100b and 100e disposed on upper and lower portions of the sheets 100a and 100d contacting the base 200 may have contents higher than those of the thermal conductive fillers 130 of the sheets 100a and 100d, and the thermal conductive fillers 130 of the sheets 100c and 100f disposed on upper and lower portions of the sheets 100b and 100e may have contents higher than those of the thermal conductive fillers 130 of the sheets 100b and 100e. Like this, the contents of the thermal conductive fillers 130 may gradually increase in a direction that is away from the base 200 to further improve heat transfer efficiency.

Figure 16:
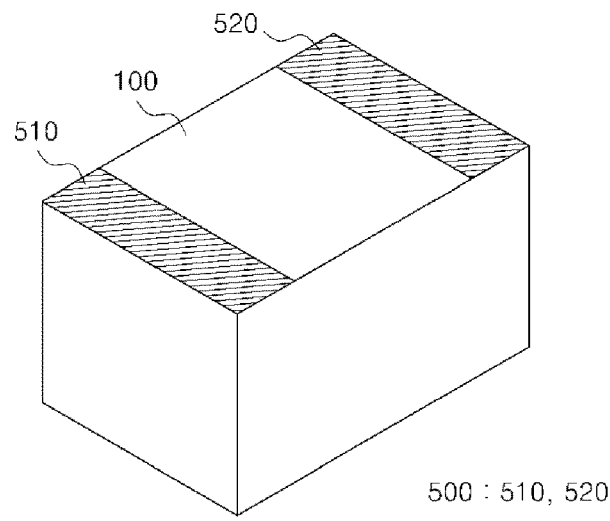

Referring to FIG. 16, the plurality of sheets 100a to 100h are stacked and compressed with the base 200 therebetween and then molded to form the body 100. Also, the second external electrodes 510 and 520 are formed on the bottom surface of the body 100, i.e., a predetermined area of the bottom surface of the body 100, which faces the PCB and is mounted on the PCB. The second external electrodes 510 and 520 may be formed on one surface perpendicular to two surfaces facing each other, on which the coil pattern 300 of the body 100 is exposed, so that the second external electrodes 510 and 520 are spaced apart from each other on a central area. For example, a seed layer may be formed by bonding a copper foil to one surface of the body 100, and then the plating process may be performed to from a plated layer on the seed layer, thereby forming the second external electrodes 510 and 520. Alternatively, a metal layer may be formed on one surface of the body 100 by a deposition process such as a sputtering process and then patterned by using lithography and etching processes to form the second external electrodes 510 and 520.

Figure 17:
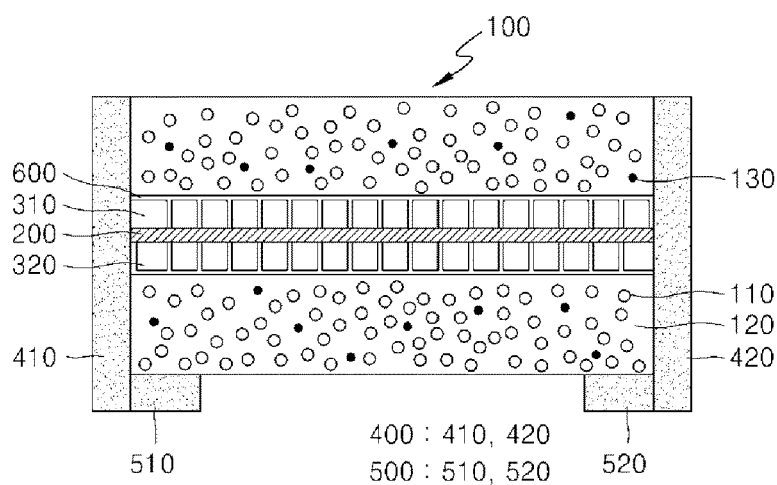

Referring to FIG. 17, the first external electrodes 410 and 420 are formed on both ends of the body 100 so that the first external electrodes 410 and 420 are electrically connected to a protruding portion of the coil patterns 310 and 320 and connected to the second external electrode 500. The first external electrodes 410 and 420 may be formed on the both ends of the body 100 through various processes including a process of applying conductive paste to a side surface of the body 100, a printing process, a deposition process, and a sputtering process. Here, when the first external electrodes 410 and 420 are coated with the conductive paste.

FIGS. 18 through 21 are cross-sectional views sequentially illustrating a method for manufacturing the power inductor in accordance with a second embodiment.

Figure 18:
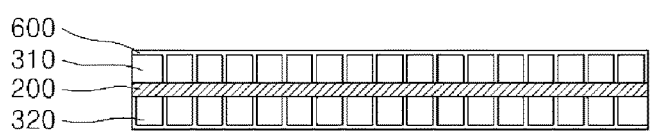
FIGS. 18 through 21 are views illustrating a method for manufacturing the power inductor in accordance with the second embodiment.

Referring to FIG. 18, coil patterns 310 and 320 are formed on at least one surface, preferably, both surfaces of a base 200, and then an insulation layer 600 is formed to cover the coil patterns 310 and 320. Here, a portion of the insulation layer 500, e.g., a portion of the insulation layer 600 formed on the coil pattern 320 is removed to expose a predetermined area of the coil pattern 320.

Figure 19:
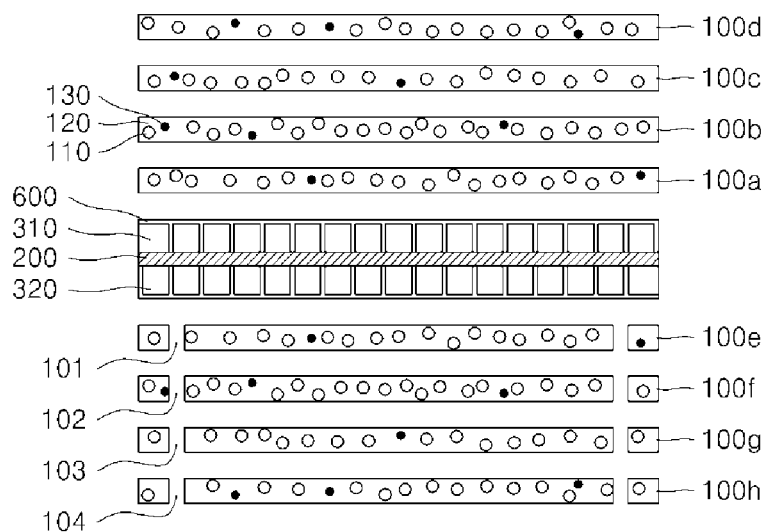

Referring to FIG. 19, a plurality of sheets 100a to 100h, each of which is formed of a material including the metal powder 110, a polymer 120, and a thermal conductive filler 130 are provided. Also, vertical through-holes 101 to 104 are formed in predetermined areas of sheets 100e to 100h disposed on a lower portion of the base 200 of the plurality of sheets 100a to 100h, respectively. Here, the holes 101 to 104 are formed in the same area as an area from which a portion of the conductive layer 500 is removed to exposed the coil pattern 320.

Figure 20:
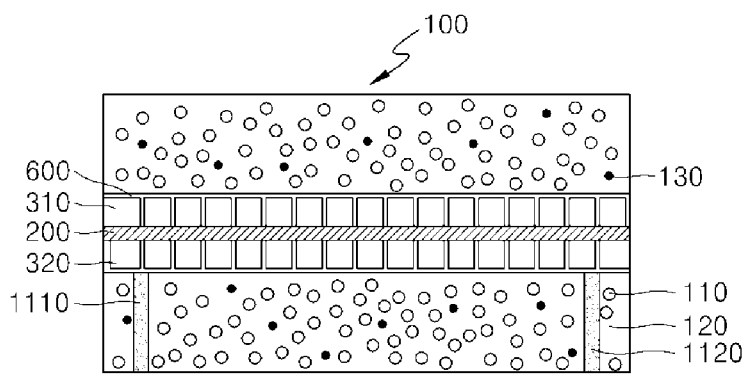

Referring to FIG. 20, the plurality of sheets 100a to 100h are stacked and compressed with the base 200 therebetween and then molded to form the body 100. Thus, a hole (not shown) for exposing at least a portion of the coil pattern 300 is formed in the bottom surface of the body 100, that is, a predetermined area of the body 100, which faces the PCB and is mounted on the PCB. Also, at least a portion of each of the coil patterns 310 and 320 is exposed through at least a side surface of the body 100. Then, the plating process is performed to grow the conductive layer from the coil pattern 300. As a result, the hole is filled to form the connection electrodes 1110 and 1120. For example, an electroless plating process may be performed to form a portion of the hole, e.g., a sidewall of the hole, and then the electroplating process may be performed to grow the connection electrode 1110 and 1120 from the coil pattern 300.

Figure 21:
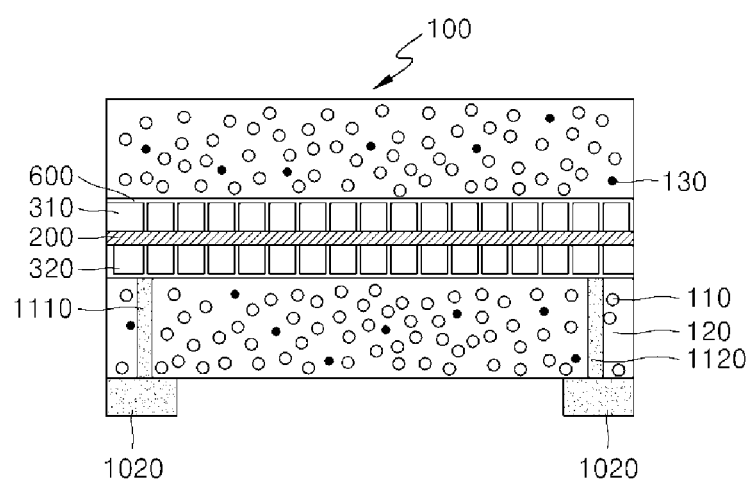

Referring to FIG. 21, the connection electrodes 1110 and 1120 are formed, and then a plating process is performed to form a conductive layer on the bottom surface of the body 100. For example, the connection electrode 1110 and 1120 may be formed by using an electroplating process, and then the electroplating process may be continuously performed to form the conductive layer on the bottom surface of the body 100 from the coil pattern 320 or the connection electrode 1100. The conductive layer on the bottom surface of the body 100 may be lithographed and etched to remove a central portion thereof, thereby forming the external electrodes 1000 (1010 and 1020) that are spaced apart from each other.

In the power inductor in accordance with the exemplary embodiment, the second external electrode may be disposed on the bottom surface of the body, which faces the PCB, and the first external electrode may be disposed on the side surface of the body and connected to the second external electrode. Also, the external electrode may be disposed on the bottom surface of the body, which faces the PCB, and the connection electrode connected to the coil may be provided in the body and connected to the external electrode. Thus, the external electrode may not be provided on the body to prevent the short-circuit between the shield can and the power inductor from occurring.

Also, the body may include the metal powder, the polymer, and the thermal conductive filler. Thus, the heat in the body, which is generated by heating of the metal powder, may be released to the outside to prevent the body from increasing in temperature, thereby preventing a problem such as reduction in inductance.

Also, at least the two bases are formed of the magnetic material to prevent the power inductor from being reduced in magnetic permeability.

Alternatively, at least two bases each of which has at least one surface on which the coil pattern is formed are provided in the body to form the plurality of coils in one body, thereby increasing the capacity of the power inductor.

The power inductor and the manufacturing method thereof may not be limited to the foregoing embodiments, but be realized through various embodiments different fro each other. Therefore, it will be readily understood by those skilled in the art that various modifications and changes can be made thereto without departing from the spirit and scope of the present invention defined by the appended claims.

What is claimed is:

1. A power inductor, comprising:
    a body having first, second, third and fourth external surfaces, wherein the third external surface is between the first and second external surfaces, wherein the first external surface is opposite the second external surface and wherein the third external surface is opposite the fourth external surface;
    a base disposed in the body;
    a coil disposed on the base;
    a plurality of first external electrodes connected to the coil, the plurality of first external electrode being disposed on first and second external surfaces of the body; and
    a second external electrode connected to the first external electrode, the second external electrode being disposed on the third surface of the body,
    wherein no external electrode is disposed on the fourth external surface of the body.

2. The power inductor of claim 1, wherein the second external electrode is mounted on a printed circuit board (PCB) and spaced apart from a central portion of the third surface of the body.

3. A power inductor, comprising:
    a body comprising a stepped portion formed on an area of a top surface thereof
    a base disposed in the body;
    a coil disposed on the base; and
    external electrodes connected to the coil, the external electrodes being disposed from first and second surfaces, which are opposite to each other, to upper and lower portions of the body, respectively
    wherein each of the external electrodes has a height less than the stepped portion on the upper portion of the body.

4. A power inductor, comprising:
    a body;
    a base disposed in the body;
    a coil disposed on the base;
    an external electrode disposed on a surface of the body such that a portion of the body is present between the external electrode and the coil along a direction; and
    a connection electrode extending within the body along the direction from the coil to the external electrode,
    wherein, along the direction, the coil is arranged between the base and the connection electrode.

5. The power inductor of claim 4, wherein the external electrode is mounted on a PCB and spaced from a central portion of the body.

6. The power inductor of claim 5, wherein the external electrode is grown from the connection electrode.

7. The power inductor of claim 1, further comprising the body comprises metal powder, a polymer, and a thermal conductive filler.

8. The power inductor of claim 7, wherein the metal powder comprises metal alloy powder comprising iron and has a surface coated with at least one of a magnetic material and an insulating material.

9. The power inductor of claim 8, wherein the thermal conductive filler comprises at least one selected from the group consisting of MgO, AlN, and a carbon-based material and is contained in a content of approximately 0.5 wt % to approximately 3 wt %, based on approximately 100 wt % of the metal powder.

10. The power inductor of claim 7, wherein the base is formed by bonding a copper foil to both surfaces of a metal plate comprising iron.

11. The power inductor of claim 7, further comprising a magnetic layer disposed on at least one area of the body and having magnetic permeability greater than that of the body.

12. The power inductor of claim 7, wherein at least two bases are provided, the coils are respectively disposed on the at least two bases, and the coils are connected to each other by a side surface electrode disposed on a fifth surface of the body.

13. A method for manufacturing a power inductor, the method comprising:
    forming a coil on at least one base;
    forming a plurality of sheets comprising metal powder and a polymer;
    stacking the plurality of sheets with the base therebetween to press the sheets, and then molding the sheets to form a body having first, second, third and fourth external surfaces, wherein the third external surface is between the first and second external surfaces, wherein the first external surface is opposite the second external surface and wherein the third external surface is opposite the fourth external surface;
    forming a plurality of second external electrodes on the third external surface of the body so as to be spaced apart from one another; and
    forming a plurality of first external electrodes each connected to the plurality of second external electrodes on the first and second external surfaces of the body,
    wherein no external electrode is disposed on the fourth external surface of the body.

14. The method of claim 13, wherein the plurality of second external electrodes are bonded to a copper foil, and then a plating process is performed to grow a plated layer from the copper foil.

15. A method for manufacturing a power inductor, the method comprising:
    forming a coil on at least one base;
    forming a plurality of sheets comprising metal powder and a polymer, in which a hole is formed in a predetermined area thereof;
    stacking the plurality of sheets with the base therebetween, compressing the sheets, and then molding the sheets to form a passing hole exposing a predetermined area of the coil;
    filling the passing hole to form a connection electrode; and
    forming an external electrode on a surface of the body and connecting the external electrode to the connection electrode.

16. The method of claim 15, wherein the connection electrode is formed by performing an electroless plating process to fill at least a portion of the passing hole and then performing an electroplating process to fill the passing hole, wherein the external electrode grows from the connection electrode by the electroplating process.

17. The method of claim 15, wherein the base is formed by bonding the copper foil to at least one surface of the metal plate comprising iron.

18. The method of claim 17, wherein the sheet further comprises a thermal conductive filler.

19. The method of claim 13, wherein the base is formed by bonding the copper foil to at least one surface of the metal plate comprising iron.

* * * * *